United States Patent [19]
Seesink

[11] Patent Number: 6,147,541
[45] Date of Patent: Nov. 14, 2000

[54] MONOLITHIC MOS-SC CIRCUIT

[75] Inventor: Petrus H. Seesink, Best, Netherlands

[73] Assignees: Endress + Hauser GmbH + Co., Maulburg; Envec Mess-und Regeltechnik GmbH + Co., Rhein; Vega Grieshaber KG, Shiltach, all of Germany; Kavlico Corporation, Moorpark, Calif.

[21] Appl. No.: 08/935,870

[22] Filed: Sep. 23, 1997

Related U.S. Application Data

[60] Provisional application No. 60/028,641, Oct. 17, 1996, abandoned.

[30] Foreign Application Priority Data

Oct. 2, 1996 [EP] European Pat. Off. ............. 96115764

[51] Int. Cl.$^7$ ........................................ G06G 7/19

[52] U.S. Cl. ............................. 327/337; 327/345

[58] Field of Search .................... 327/337, 344, 327/345, 171, 54, 73, 291, 363

[56] References Cited

U.S. PATENT DOCUMENTS

| 5,189,316 | 2/1993 | Murakami et al. | 327/530 |
|---|---|---|---|
| 5,498,986 | 3/1996 | Manlove | 327/337 |
| 5,502,417 | 3/1996 | Uriya | 327/541 |
| 5,585,756 | 12/1996 | Wang | 327/337 |
| 5,604,685 | 2/1997 | Seesink et al. | 364/573 |
| 5,619,170 | 4/1997 | Nakamura | 327/291 |
| 5,745,002 | 4/1998 | Baschirotto et al. | 327/337 |

OTHER PUBLICATIONS

Goodenough, Frank, *Hot and Getting Hotter, These Ics are Now Software Programmable*, 2328 Electronic Design, 37 Apr. 13, 1989, No. 8, Hasbrouck Heights, NJ, pp. 77–80, 86, 90, and 92.

Mariano, Aceves M., Torres, Alfonso, Prieto, Arturo, Glaenzer, Richard, and Worley, John, *Advanced Technologies and Processes in Communication and Power Systems*, 7th European Conference on Electrotechnics, Apr. 21–23, 1986, Paris, France, pp. 659–664.

Hosticka, bedrich J., Brockherde, Werner, Kleine, Ulrich, and Schweer, Rainer, *Design of Nonlinear Analog Switched–Capacitor Circuits Using Building Blocks*, 8090 IEEE Transactions on Circuits and Systems, CAS–31 (1984) Apr., No. 4, New York, NY, pp. 354–368.

*Primary Examiner*—Jung Ho Kim
*Attorney, Agent, or Firm*—Bose McKinney & Evans LLP

[57] ABSTRACT

With regard to a significant reduction in the tolerance range or margin to be taken into account in the design of a switched-capacitor circuit which is monolithically integrated by means of enhancement-mode insulated-gate field-effect transistors there is provided at least one opamp. This opamp contains a resistor which determines its quiescent current and is realized as a transistor operated in the permanently current-conducting state. An on-chip clock oscillator generates a clock signal. This oscillator is either an RC clock oscillator, whose frequency is determined by an oscillator resistor, which is realized as a transistor operated in the permanently current-conducting state, and an oscillator capacitor, or a current-controlled clock oscillator, whose frequency is determined by the quiescent current of the opamp. At least one capacitor is charged or discharged during operation by the opam via at least one switch in the form of a transistor clocked by the clock signal.

1 Claim, 4 Drawing Sheets

MONOLITHIC MOS-SC CIRCUIT

Priority of the provisional application Ser. No. 60/028,641 filed Oct. 17, 1996, now abandoned, is claimed in this application under 35 U.S.C. 119(e).

FIELD of the INVENTION

The invention relates to a switched-capacitor circuit which is monolithically integrated by means of enhancement-mode insulated-gate field-effect transistors, abbreviated to MOS-SC circuit below, which is therefore realized on and in a semiconductor chip.

BACKGROUND of the INVENTION

Essential parts of such MOS-SC circuits are:

operational amplifiers the respective quiescent current of which is determined by a resistor or by a constant-current source which may be part of a current mirror, an on-chip clock oscillator for generating a clock signal or an RC clock oscillator whose frequency is determined by a oscillator resistor and an oscillator capacitor, capacitors connected between a signal input and a signal output, and switches in the form of transistors, via which the respective capacitors are charged or discharged during operation by the respective operational amplifiers, clocked by the clock signal.

In the case of MOS-SC circuits having the two above-mentioned types of clock oscillators, their frequency and/or their frequency stability are not so critical. Such MOS-SC circuits are, for example, SC analog/digital converters or SC digital/analog converters or the circuit described U.S. application Ser. No. 08/342,218 of Nov. 18, 1994.

SUMMARY OF THE INVENTION

The following problem elements arise, inter alia, during the monolithic realization of MOS-SC circuits of this type, that is to say when drafting the concrete layout of the individual semiconductor layers and the exposure and diffusion masks necessary therefor, the so-called design, and when selecting the concrete technical semiconductor process steps:

a) The settling time of operational amplifiers must, on the one hand, be short enough that the error caused by the settling time is sufficiently small, for example amounts to 0.1%, on the other hand the settling time must not be so short that the power requirement is greater than necessary and the noise sensitivity is increased owing to the increase in the noise bandwidth.

b) The concrete settling time of a manufactured operational amplifier is determined by the actually realized value of the resistance which defines its quiescent current, or by the actually realized value of the current of the constant-current source; for this the production tolerance in each case lies in the region of 20%.

c) The concrete transconductance of the individual transistors essentially depends on tolerances of the doping of the individual semiconductor regions, on tolerances of the thickness of silicon dioxide layers produced or deposited, that is to say present, outside the gate region, in other words the so-called field oxide, on tolerances of the gate threshold voltage and on tolerances of the channel length; for this the production tolerance lies in the region of 50%.

d) The concrete value of the tolerance of the capacitance of the capacitors usually amounts to 20%.

e) The resistance in the current-conducting state of the transistors which realize the switches, that is to say their so-called respective ON resistance, must, on the one hand, be small enough that the time constant formed by it and the associated capacitor is small enough, and, on the other hand, must not be so small that clock feedthrough and greater leakage effects than necessary occur.

f) The time constants of the individual switch-capacitor elements determine, together with the settling time of the respective operational amplifiers and, furthermore, together with the operating temperature and the concrete value of the operating voltage, the total settling time. In this case, the respective switch-capacitor-operational amplifier units must have settled within a time duration which is determined by the pulses generated by the clock oscillator. In this case, all of the abovementioned tolerances are effective or to be taken into account, which lie in the region of 50 % according to the above explanations. The tolerance of the frequency of an on-chip RC clock oscillator in this case lies in the region of 20% to 30%.

g) Since the above mentioned tolerances of the SC circuit and the last-mentioned tolerance of the clock oscillator are generally not correlated with one another, and are thus added, a tolerance range which is too large to be taken into account results for the abovementioned design from the worst case point of view. This situation can be illustrated by the difference between the period of the clock signal and the required typical value of the settling time of the operational amplifiers, which difference is in this case referred to as margin M and lies in the region of 80% in the worst case. Even if the above mentioned tolerances of the SC circuit and the tolerance of the clock oscillator are correlated with one another, at best a margin of 30% can be achieved.

The invention serves to solve these problems with regard to a significant reduction in the tolerance range or margin to be taken into account in the design.

To this end, the invention consists in a switched-capacitor circuit which is monolithically integrated by means of enhancement-mode insulated-gate field-effect transistors having at least one operational amplifier,
    which contains a resistor which determines its quiescent current and is realized as a transistor operated in the permanently current-conducting state, having an on-chip clock oscillator for generating a clock signal,
    which is either an RC clock oscillator, whose frequency is determined by an oscillator resistor, which is realized as a transistor operated in the permanently current-conducting state, and an oscillator capacitor, or which is a current-controlled clock oscillator, whose frequency is determined by the quiescent current of the operational amplifier, having at least one capacitor and having at least one switch in the form of a transistor, via which the capacitor is charged or discharged during operation by the operational amplifier, clocked by the clock signal.

In a preferred embodiment of the invention, the permanently current-conducting transistor is realized by a suitably biased CMOS transmission gate.

In order to achieve the above-mentioned problem solution, therefore, according to the invention both the resistor which determines the quiescent current of the operational amplifiers and the frequency-codetermining oscillator resistor are each realized as the ON resistance of an MOS transistor operated in the permanently current-conducting state.

One advantage of the invention consists in the fact that the tolerance range or the margin can be brought towards 10%, since the speed of the SC circuit is tracked with the period of the clock signal.

Consequently, a resultant further advantage is a smaller noise level, since, on account of the narrower bandwidth of the operational amplifiers, the noise spectrum caused by aliasing appears to a lesser extent in frequency ranges above the frequency of the clock signal. Furthermore, the above-mentioned power requirement is reduced and the clock feedthrough explained above is avoided to the largest possible extent.

BRIEF DESCRIPTION of the DRAWINGS

The invention and its further properties will now be explained in more detail with reference to the figures of the drawing, in which identical or mutually corresponding parts are provided with the same reference symbols.

DETAILED DESCRIPTION of the DRAWINGS

Figure 1A:
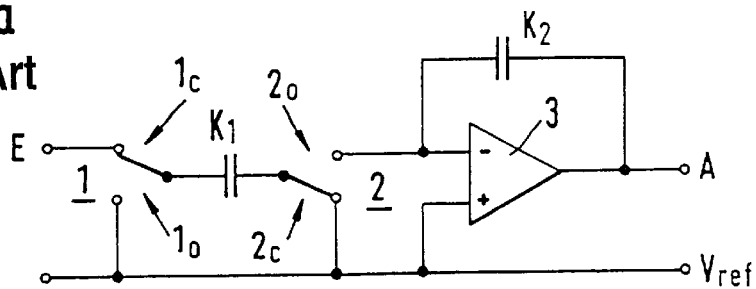
FIGS. 1a to 1c show a circuit diagram of a simple SC circuit with the realization of conducting and non-conducting switching paths by means of CMOS transmission gates.

FIG. 1a shows a circuit diagram of a simple SC circuit which can also be understood as the basic circuit of extensive SC circuits on which the latter are built up. An input E can, on the one hand, be connected via a first switching path $1_c$ of a first changeover switch 1 to a first terminal of a first capacitor $K_1$ and, on the other hand, can be connected via a second switching path $1_o$ to a reference potential $V_{ref}$, which may be, for example, the potential of a circuit zero-point.

A second terminal of the first capacitor $K_1$ can be connected, on the one hand, via a first switching path $2_o$ of a second changeover switch 2 to an inverting input of an operational amplifier 3 and, on the other hand, can be connected via a second switching path $2_c$ to the reference potential $V_{ref}$. A non-inverting input of the operational amplifier 3 is connected to the reference potential $V_{ref}$. An output A of the operational amplifier 3 is connected via a second capacitor $K_2$ to its inverting input and can consequently also be connected to the second terminal of the first capacitor $K_1$.

In the switch position of the two changeover switches 1, 2 which is shown in FIG. 1a, the first capacitor $K_1$ is charged by a signal present at the input E. If the two changeover switches 1, 2 are brought to their other switch positions, the charging is interrupted or terminated and the charge which has passed to the first capacitor $K_1$ is forwarded to the second capacitor $K_2$.

CMOS transmission gates can serve as an example of a preferred realization of conducting and non-conducting switching paths of changeover switches of SC circuits, which CMOS transmission gates are, as is known, partial circuits of integrated CMOS circuits, that is to say of integrated circuits having complementary enhancement-mode insulated-gate field-effect transistors. However, field-effect transistors of a uniform conduction type can also be used to realize the switching paths.

Figure 1B:
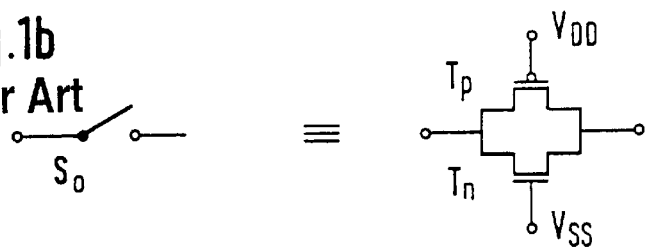
Figure 1C:
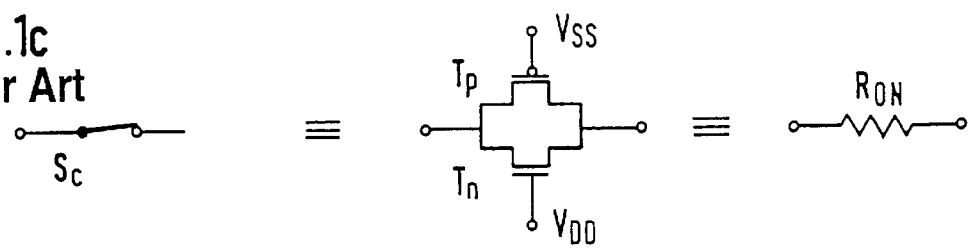

FIGS. 1b and 1c show the realization of an open and closed switching path $S_o$ and $S_c$, respectively, by means of a CMOS transmission gate. This comprises the parallel circuit formed by the controlled current paths of a P-channel transistor $T_p$ and an N-channel transistor $T_n$.

In order that, in accordance with FIGS. 1b, both transistors are switched off and consequently both current paths are non-conducting, as is known a voltage $V_{DD}$ is present at the gate of the P-channel transistor $T_p$ and, at the same time, a voltage $V_{SS}$ is present at the gate of the N-channel transistor $T_n$. The voltage $V_{DD}$ is significantly more negative than the gate threshold voltage of the P-channel transistor $T_p$, and the voltage $V_{SS}$ is significantly more positive than the gate threshold voltage of the N-channel transistor $T_n$.

In order that, in accordance with FIG. 1c, both current paths of the two transistors are conducting, the voltage $V_{SS}$ is now present at the gate of the P-channel transistor $T_p$ and, at the same time, the voltage $V_{DD}$ is present at the gate of the N-channel transistor $T_n$. The voltage $V_{DD}$ is now significantly more positive than the gate threshold voltage of the P-channel transistor $T_p$, and the voltage $V_{SS}$ is significantly more negative than the gate threshold voltage of the P-channel transistor $T_n$. The two switched-on complementary transistors consequently realize a resistor RON, which can normally have a value of the order of magnitude of 10 kΩ.

Figure 2:
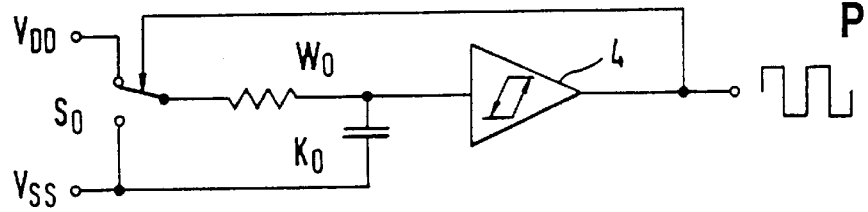
FIG. 2 shows a basic circuit diagram of an RC oscillator.

FIG. 2 illustrates the basic circuit diagram of an RC oscillator. Via an oscillator resistor $W_O$, an oscillator changeover switch $S_O$ switches an oscillator capacitor $K_O$ back and forth between the voltages $V_{DD}$ and $V_{SS}$. In order that this proceeds in a free-running manner, the junction point between the oscillator resistor $W_O$ and the oscillator capacitor $K_O$ is connected to an input of a Schmitt trigger 4, an output of which is connected to the control input of the oscillator changeover switch $S_O$. A square-wave signal is thus produced at this output, the frequency of which square-wave signal is essentially determined by the time constant of the RC element formed by the resistor $W_O$ and the capacitor $K_O$. As is known, this is equal to the product of the value R of the resistor $W_O$ and the value C of the capacitor $K_O$.

Figure 3:
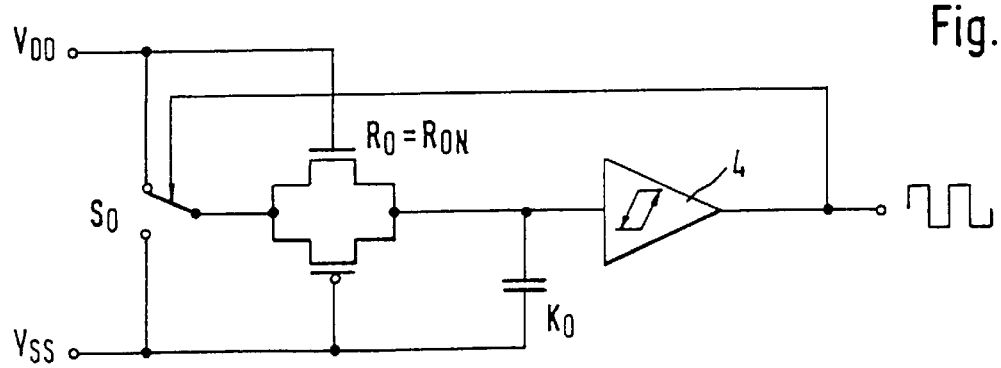
FIG. 3 shows a circuit diagram of an RC clock oscillator according to the invention.

FIG. 3 shows a circuit diagram, which largely corresponds to the circuit diagram of FIG. 2, of an RC clock oscillator in accordance with one aspect of the invention. The difference from FIG. 2 consists in the fact that the resistor $W_O$ is realized by a permanently switched-on CMOS transmission gate in accordance with FIG. 1c, with the result that the following holds true for the value R of the resistor $W_O$:R $R_{ON}$.

Figure 4:
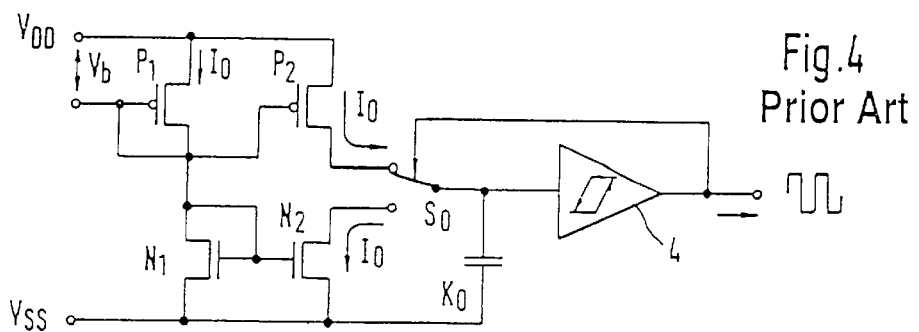
FIG. 4 shows a basic circuit diagram of a current-controlled clock oscillator realized using CMOS technology.

FIG. 4 shows a basic circuit diagram of a customary current-controlled clock oscillator which is realized using CMOS technology. In this case, the resistor $W_O$ according to FIGS. 2 and 3 is replaced by a CMOS current mirror. The latter comprises a series circuit formed by a P-channel resistor $P_1$ and an N-channel transistor $N_1$ as well as a further P-channel transistor $P_2$ and a further N-channel transistor $N_2$.

In the series circuit, the controlled current paths of the P-channel transistor $P_1$ and of the N-channel transistor $N_1$ are connected in series in such a way that the drain of the P-channel transistor $P_1$ is connected to the voltage $V_{DD}$ and the source of the N-channel transistor $N_1$ is connected to the voltage $V_{SS}$.

The drain of the P-channel transistor $P_2$ is likewise connected to the voltage $V_{DD}$ and the source of the N-channel transistor $N_2$ is likewise connected to the voltage $V_{SS}$. The gates of the two N-channel transistors $N_1$, $N_2$ are connected to one another and, furthermore, are connected to the junction point between the two transistors of the series circuit, that is to say to the drain of the N-channel transistor $N_1$ and to the source of the P-channel transistor $P_1$. The respective gate of the two P-channel transistors $P_1$, $P_2$ is also connected to this junction point.

The source of the further P-channel transistor $P_2$ is connected to a first input of the changeover switch $S_O$ and the drain of the further N-channel transistor $N_2$ is connected to a second input of the changeover switch $S_O$. The output of the latter is connected, as in FIG. 3, to the input of the Schmitt trigger 4 and to the capacitor $K_O$.

There is present between the voltage $V_{DD}$ and the gate of the P-channel transistor $P_1$ a bias voltage $V_b$, which codetermines the quiescent current $I_O$ flowing in this transistor. The quiescent current $I_O$ can consequently be set by the user by means of the bias voltage $V_b$.

On account of the known properties of a current mirror, this quiescent current $I_O$ thus also flows in the further P-channel transistor $P_2$ if, as is depicted in FIG. 4, the changeover switch $S_O$ is in the position depicted, and consequently charges the capacitor $K_O$.

When the Schmitt trigger 4 switches the changeover switch $S_O$ to its other switch position, then the capacitor $K_O$ is discharged again by the quiescent current $I_O$. This quiescent current $I_O$ now flows, namely, through the further N-channel transistor $N_2$, because this quiescent current also flows in the N-channel transistor $N_1$ and the current mirror property dictates this.

Figure 5:
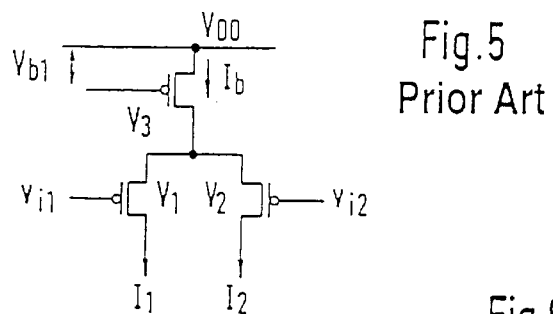
FIG. 5 shows a basic circuit diagram of a simple differential amplifier realized using P-channel transistors.

FIG. 5 shows a basic circuit diagram of a simple differential amplifier, which is realized using P-channel transistors, as the basic element of operational amplifiers. The differential amplifier comprises two amplifier transistors $V_1$, $V_2$, the drains of which are connected to one another and are coupled to the voltage $V_{DD}$ via the controlled quiescent current path of a constant-current transistor $V_3$. There is present between the gate of the latter and the voltage $V_{DD}$ a bias voltage $V_{b1}$, which codetermines the quiescent current $I_b$ flowing in this transistor. Consequently, in this case, too, the quiescent current $I_b$ can be set by the user by means of the bias voltage $V_{b1}$.

A quiescent current $I_1$ and, respectively, $I_2$ flows in the amplifier transistor $V_1$ and in the amplifier transistor $V_2$, in which case, as is characteristic of differential amplifiers, the sum of these two currents is constant and equal to the quiescent current $I_b$:

$$I_1 + I_2 = I_b = \text{constant}$$

The quiescent current $I_b$ is divided between the two amplifier transistors $V_1$, $V_2$ as a function of a difference between variable signals $v_{i1}$ and $v_{i2}$ present at the respective gate of the amplifier transistors $V_1$, $V_2$, with the result that variable currents $i_1$, $i_2$ flow in them. These currents $i_1$, $i_2$ are further processed in further stages of the operational amplifiers or in other stages of an integrated circuit.

The following holds for the transconductance $g_m$ of such a differential amplifier:

$$g_m = \delta(i_1 - i_2)/\delta(v_{i1} - v_{i2}) \approx \sqrt{2\beta_p I_b w/l}.$$

In this, $\beta_p$ is a production-dictated constant.

Despite various possible ways of realizing operational amplifiers on the basis of the differential amplifier basic element described, the transconductance of the operational amplifiers is always a function of the transconductance of the differential amplifier basic element. Therefore, the bandwidth or the pole frequency $f_p$ of the operational amplifier is a function of the quiescent current $I_b$, because the following holds true for $f_p$: $f_p = g_m/(2\pi c)$, where the capacitive load of the amplifier output is designated by c.

In the case of a two-stage amplifier, c is the known Miller capacitance. At all events the capacitive load c must be of the same type as the capacitors otherwise used in the SC circuit and in the clock oscillator.

FIG. 6 shows circuit diagrams of different simple quiescent current setting circuits of MOS or CMOS operational amplifiers. FIG. 6a shows a P-channel transistor P, the controlled current path of which is connected in series with a resistor W between the voltage $V_{DD}$ and the voltage $V_{SS}$, which resistor has the resistance R.

The gate of the transistor P is connected to its junction point with the resistor W, and across this gate is a bias voltage $V_{b1}$ codetermining the quiescent current $I_b$ which flows in the series circuit formed by the resistor W and the transistor P. Codetermining because the quiescent current $I_b$ also depends on the dimensioning of the channel of the transistor W, namely on the quotient w/1 (w is the width of the said channel and 1 is its length). The following holds true for the quiescent current $I_b$:

$$I_b \sim (V_{DD} - V_{SS} - V_{b1})/R.$$

Figure 6A:
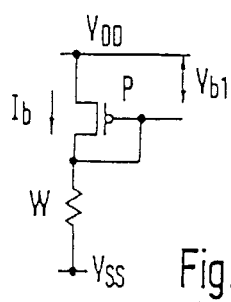
FIGS. 6a to 6f show circuit diagrams of different simple quiescent current setting circuits of MOS or CMOS operational amplifiers.
Figure 6B:
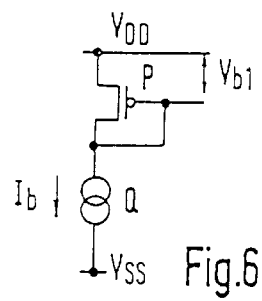
Figure 6C:
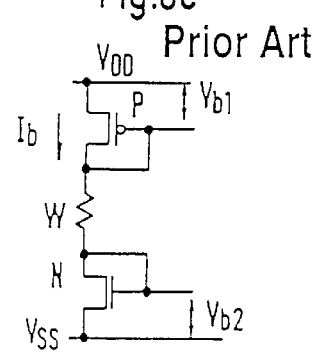

In the circuit according to FIG. 6b, the resistor W of FIG. 6a is replaced by a constant-current source Q. In FIG. 6c, the controlled current path of an N-channel transistor N is connected in series with the resistor W at the voltage $V_{SS}$ end. The gate of the transistor N is connected to its junction point with the resistor W, and across this gate is a bias voltage $V_{b2}$, which additionally codetermines the quiescent current $I_b$ flowing in the series circuit formed by the transistor P, the resistor W and the transistor N. The following holds true here for the quiescent current $I_b$:

$$I_b \sim (V_{DD} - V_{SS} - V_{b1} - V_{b2})/R.$$

Figure 6D:
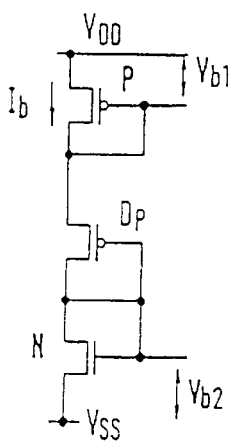

In FIG. 6d, the resistor W of FIG. 6c is replaced by a P-channel transistor $D_P$ connected as a diode, in that the controlled current path of the said P-channel transistor $D_P$ is inserted into the series circuit formed by the P-channel transistor P and the N-channel transistor N. In this case, the gate of the transistor $D_P$ is connected to its junction point with the N-channel transistor N, that is to say also to the gate of the latter.

Figure 6E:
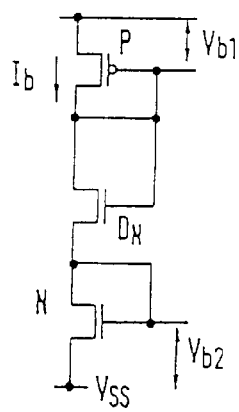

In FIG. 6e, the resistor W of FIG. 6c is replaced by an N-channel transistor $D_N$ connected as a diode, in that the controlled current path of the said N-channel transistor $D_N$ is inserted into the series circuit formed by the P-channel transistor P and the N-channel transistor N. In this case, the gate of the transistor $D_N$ is connected to its junction point with the P-channel transistor P, that is to say also to the gate connection of the latter.

The respective transistor $D_P$ or DN connected as a diode usually has a small w/l ratio, in order to obtain a quiescent current setting circuit having a small power loss.

Figure 6F:
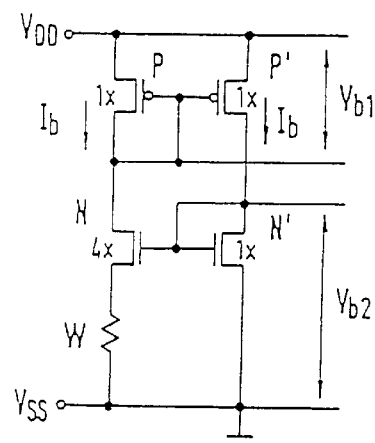

FIG. 6f shows a quiescent current setting circuit having a very much smaller power loss. Two parallel circuit paths are formed. The quiescent current $I_b$ flows in each of them. A first circuit path, the left-hand one in FIG. 6f, comprises, viewed starting from the voltage $V_{DD}$, the series circuit formed by the P-channel transistor P, the N-channel transistor N and the resistor W. A second circuit path, the right-hand one in FIG. 6f, comprises, viewed starting from the voltage $V_{DD}$, the series circuit formed by a further P-channel transistor P' and a further N-channel transistor N'.

The gate of the further P-channel transistor P' is connected to the gate of the P-channel transistor P. The gate of the further N-channel transistor N' is connected to the gate of the N-channel transistor N and is connected to the junction point between the two further transistors. The connection between the gate of the N-channel transistor N and its drain, as is present in FIG. 6e, is not present.

The N-channel transistor has an increased w/l ratio in comparison with the respective w/l ratio of these transistors P, P', N'; this is illustrated by the designation 1× in the case of the transistors P, P', N'and the designation 4× in the case of the transistor N, where 4× is intended to indicate that the w/l ratio of the said transistor N is four times greater than that of the transistors P, P', N'.

The current mirror formed by the transistors P, P' ensures that the quiescent current $I_b$ in the first circuit path is identical to the quiescent current $I_b$ in the second circuit path. The gate-source voltage $V_{gsN'}$ of the transistor N' is therefore smaller than the gate-source voltage $V_{gsN}$ of the transistor N. Consequently, the following holds true for the quiescent current $I_b$:

$$I_b = (V_{gsN'} - V_{gsN})/R.$$

Figure 7A:
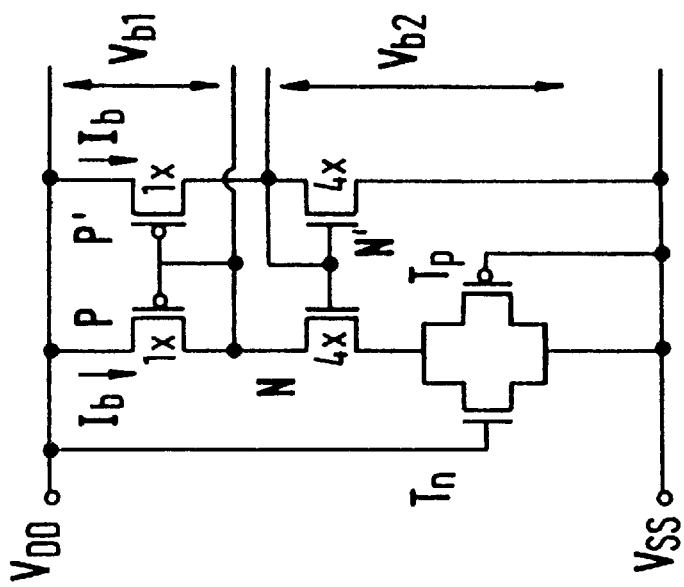
FIGS. 7a to 7c shows circuit diagrams of different inventive quiescent current setting circuits of MOS or CMOS operational amplifiers.
Figure 7B:
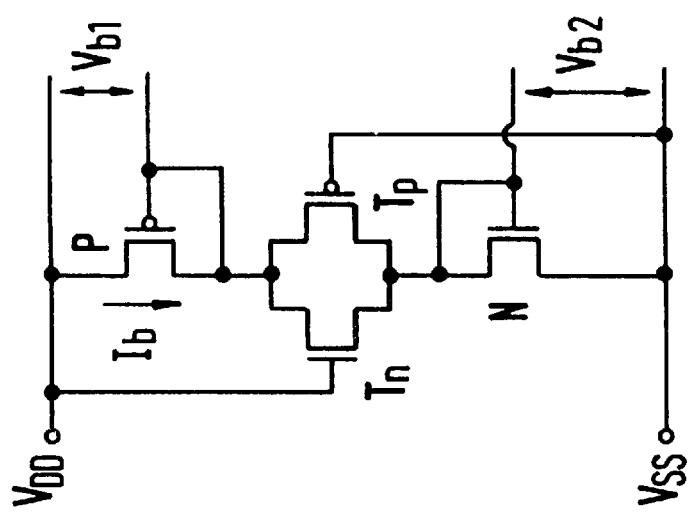
Figure 7C:
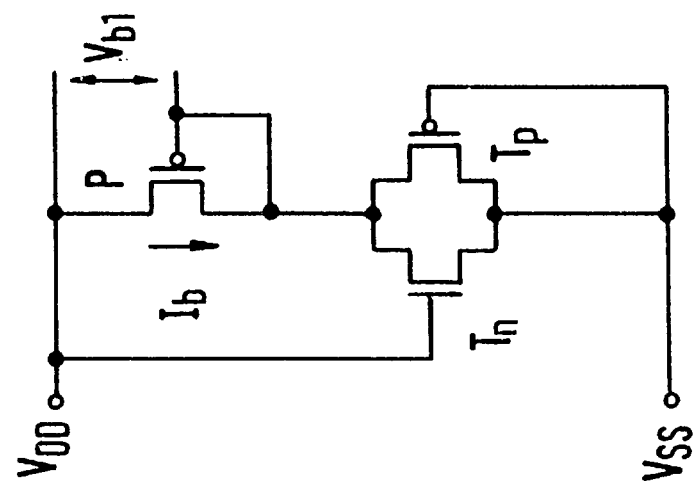
Figure 8:
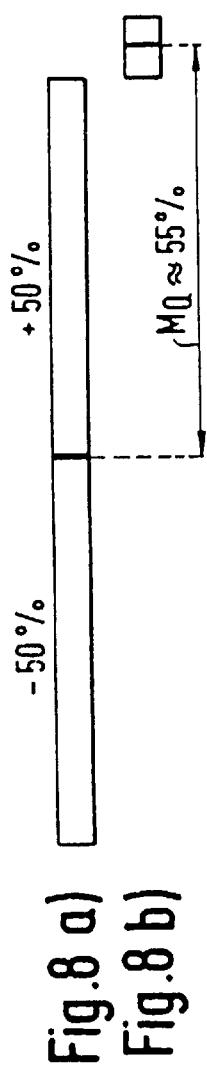
FIGS. 8 to 11 show different margin diagrams.
Figure 9:
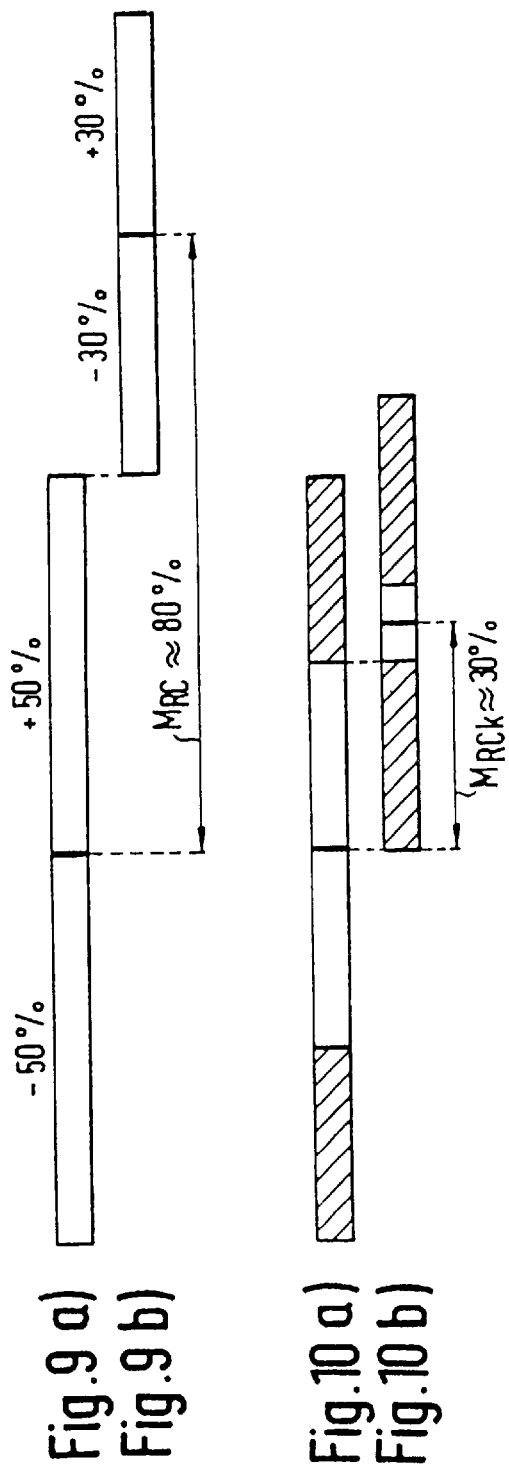
Figure 10:
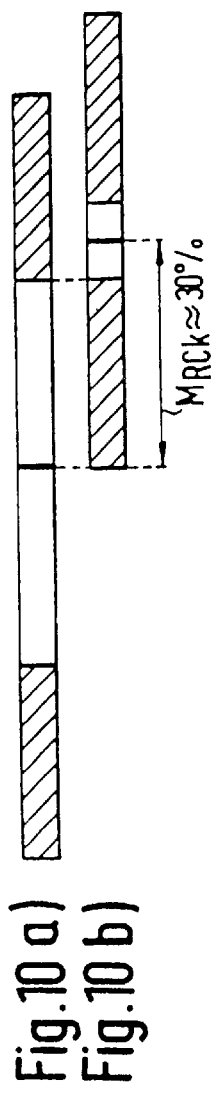
Figure 11:
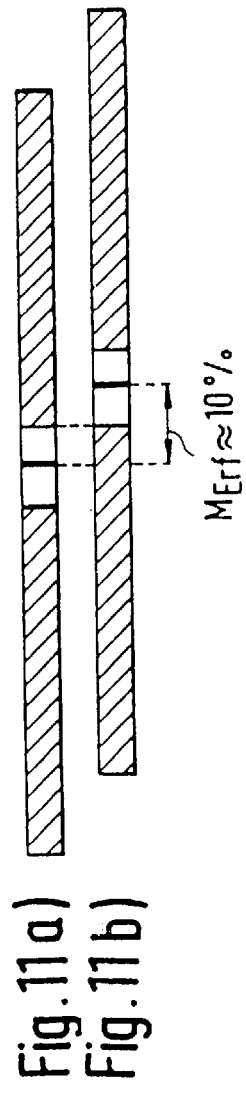

FIGS. 7a to 7c illustrate quiescent current setting circuits comparable to FIGS. 6a, 6c and 6f, in which circuits, according to the invention, the respective resistor W is replaced by a permanently switched-on CMOS transmission gate according to FIG. 1c.

In order to illustrate the advantages which can be achieved with the invention, the respective two partial FIGS. a) and b) of FIGS. 8 to 11 illustrate a number of bar diagrams of the margin, the latter in the sense defined above, cf. section g). The partial FIG. a) each relate to the necessary settling time of the MOS-SC circuit and the respective partial FIG. b) to the period of the clock signal.

In this case, the rectangles which are not filled in represent the respective average tolerance ranges, the hatched rectangles represent partial tolerance ranges which are correlated with one another, and the narrow filled-in rectangles represent typical values.

FIGS. 8a and 8b show, as was already mentioned above, the average tolerance range of the required settling time of an integrated MOS operational amplifier (±50%) and, respectively, the tolerance range of a crystal oscillator serving as a clock pulse generator. The resultant margin $M_Q$ in this case amounts to approximately 55%.

FIGS. 9a and 9b show the conditions given with an integrated MOS operational amplifier (tolerance range again ±50%) and, respectively, a customary on-chip RC oscillator as clock pulse generator, when there is no correlation between their tolerance ranges. FIG. 9a is identical to FIG. 8a, and FIG. 9b shows the average tolerance range of the on-chip RC oscillator to be ±30%. The margin MRC in this case amounts to approximately 80%.

FIGS. 10a and 10b show the conditions given with a customary on-chip RC oscillator as clock pulse generator when there is typical correlation between their tolerance ranges. FIG. 10a shows the average tolerance range of the required settling time of an integrated MOS operational amplifier of again ±50 % with a partial tolerance range of ±25%.

Therefore, in FIG. 10b, the left-hand edge of the tolerance range of the on-chip RC oscillator can be shifted to the typical value of FIG. 10a. Since this tolerance range has a correlated partial tolerance range likewise of ±25%, the margin $M_{RCk}$ in this case amounts to only ±30%, but this is still too large.

According to the invention, in accordance with FIGS. 11a and 11b, it is now possible to increase the respective partial tolerance range of the settling time of the operational amplifiers (FIG. 1a) and of the on-chip RC oscillator (FIG. 1b) to in each case ±40%, with the result that the margin $M_{Erf}$ is now only ±10%. Consequently, the design of the MOS-SC circuit can be based on significantly improved boundary conditions.

Although the conditions when using an on-chip RC oscillator were explained with reference to FIGS. 8 to 11, comparable considerations also apply to the current-controlled oscillator according to the invention.

In cases where the tolerance of the power loss cannot remain unconsidered, it is possible to provide a trimmable and thus adjustable quiescent current in the design of the layout of the MOS-SC circuit. In that case, the total quiescent current is increased when the resistance which determines the quiescent current is increased. This can be realized, for example, by connecting more and more CMOS transmission gates in series or, for example, by increasing the respective current ratio of the current mirrors for the quiescent current.

The setting value required for an individual MOS-SC circuit can be determined in the course of production during testing of the said circuit and be stored in a memory, for example an EEPROM or the like.

This quiescent current trimming does not increase the margin $M_{Erf}$ very much. A trimming margin of 25% normally suffices to achieve an acceptable supply current tolerance, since the rise in the settling time error of the switches on account of its exponential dependence is not so large. Consequently, in the case of the invention, the settling time error is less dependent on supply voltage, temperature and process parameter changes.

What is claimed is:

1. A switched-capacitor circuit which is monolithically integrated by means of enhancement-mode insulated-gate field-effect transistors, comprising:

at least one operational amplifier, which contains a resistor which determines the amplifier's quiescent current and is realized by a suitably biased CMOS transmission gate in a permanently conducting state;

an on-chip clock oscillator for generating a clock signal, which is a current-controlled clock oscillator;

at least one capacitor; and at least one switch in the form of a transistor that is connected to said at least one operational amplifier, via which the capacitor is charged or discharged during operation by said at least one operational amplifier, clocked by the clock signal.

* * * * *